(12) United States Patent
Gobeil et al.

(10) Patent No.: US 9,437,997 B2
(45) Date of Patent: Sep. 6, 2016

(54) PROCESS FOR ATTACHING DEVICES TO A CIRCUIT BOARD

(71) Applicant: Signalcraft Technologies, Calgary, Alberta (CA)

(72) Inventors: Bernard Gobeil, Calgary (CA); Todd Smiley, Calgary (CA); Jason McKay, Calgary (CA)

(73) Assignee: Signalcraft Technologies, Calgary, Alberta (CA)

( * ) Notice: Subject to any disclaimer, the term of this patent is extended or adjusted under 35 U.S.C. 154(b) by 229 days.

(21) Appl. No.: 14/255,811

(22) Filed: Apr. 17, 2014

(65) Prior Publication Data

US 2014/0317917 A1    Oct. 30, 2014

Related U.S. Application Data

(60) Provisional application No. 61/816,650, filed on Apr. 26, 2013.

(51) Int. Cl.
| | |
|---|---|
| *H05K 3/00* | (2006.01) |
| *H01R 43/02* | (2006.01) |
| *H01R 12/70* | (2011.01) |
| *H05K 3/30* | (2006.01) |
| *H05K 3/34* | (2006.01) |

(52) U.S. Cl.
CPC ....... *H01R 43/0263* (2013.01); *H01R 12/7011* (2013.01); *H05K 3/303* (2013.01); *H05K 3/0011* (2013.01); *H05K 3/3405* (2013.01); *H05K 2201/0909* (2013.01); *H05K 2201/09127* (2013.01); *H05K 2201/10189* (2013.01); *H05K 2203/0169* (2013.01); *Y02P 70/613* (2015.11); *Y10T 29/4913* (2015.01); *Y10T 29/49124* (2015.01); *Y10T 29/49208* (2015.01); *Y10T 29/53265* (2015.01)

(58) Field of Classification Search
CPC .............. H01R 12/7011; H01R 12/79; G01R 31/2863; Y10T 29/49208; Y10T 29/49204; Y10T 29/4913; Y10S 414/109
USPC ......... 29/829, 760, 832, 842, 874, 876, 884; 439/63, 65, 328, 349, 581, 701
See application file for complete search history.

(56) References Cited

U.S. PATENT DOCUMENTS

| | | | |
|---|---|---|---|
| 7,766,696 B2* | 8/2010 | Conner | H01R 13/518 439/581 |
| 8,105,092 B2* | 1/2012 | Weidner | H01R 24/50 439/581 |

* cited by examiner

*Primary Examiner* — Thiem Phan
(74) *Attorney, Agent, or Firm* — Lee & Hayes, PLLC

(57) ABSTRACT

Systems, methods and apparatuses for attaching devices to ends of a circuit board. An exemplary method includes removing or creating at least a portion of a sacrificial part of a circuit board based on a predefined pattern, inserting a holder device into a remaining portion of the sacrificial part of the circuit board, placing a device at a predefined location on the circuit board, wherein the device is at least partially supported by a portion of the holder device, attaching the device to the circuit board and removing the holder device and the sacrificial part of the circuit board.

6 Claims, 6 Drawing Sheets

PROCESS FOR ATTACHING DEVICES TO A CIRCUIT BOARD

CROSS REFERENCE TO RELATED PATENT APPLICATIONS

This patent application claims the benefit of U.S. Provisional Patent Application 61/816,650, filed Apr. 26, 2013, which application is fully incorporated herein by reference.

BACKGROUND

In many circuit board designs, jacks, plugs or other types of devices must be mounted to the edge of the circuit board. The process for attaching these type of devices to be circuit board edge is time-consuming and lacks accuracy of placement. One must manually hold or devise an external fixture the device in the proper position at the edge of the circuit board and then solder the device to the circuit board without allowing the device to move relative to the circuit board during soldering. This requires a steady hand of the operator or very complicated and expensive fixtures or machinery.

SUMMARY

The disclosure provides systems, methods and apparatuses for attaching devices to ends of a circuit board. An exemplary method includes removing at least a portion of a sacrificial part of a circuit board based on a predefined pattern, inserting a holder device into a remaining portion of the sacrificial part of the circuit board, placing a circuit device at a predefined location on the circuit board, wherein the device is at least partially supported by a portion of the holder device, attaching the device to the circuit board and removing the holder device and the sacrificial part of the circuit board.

In some embodiments, the circuit devices are attached by applying a solder paste to a predefined location on the circuit board and performing a predefined solder flow process.

In further embodiments, the holder device is inserted in place by applying pressure to the holder device perpendicular to a major plane of the circuit board.

Also or instead, a groove is cut, etched or machined between the sacrificial part and a base of the circuit board.

In various embodiments, an automated system or manual process performs the operations described above. An exemplary system includes a controller, a device that removes at least a portion of the sacrificial part of the circuit board or removes a component temporarily attached to the circuit board based on a signal received from the controller, a placement device that inserts a holder device into a remaining portion of the sacrificial part of the circuit board based on a second signal received from the controller and places a device at a predefined location on the circuit board based on a third signal received from the controller, an attachment device that attaches the device to the circuit board and a device that removes the holder device and the sacrificial part of the circuit board identified by the predefined pattern based on a fourth signal received from the controller. The device is at least partially supported by a portion of the inserted holder device.

In some embodiments, the attachment device applies a solder paste to a predefined location on the circuit board and performs a predefined solder flow process. The application of the solder paste and the performance of the solder flow process are performed based on instructions received from the controller.

In other embodiments, the device is inserted manually and automatically soldered. In yet another embodiment, the device is inserted and soldered manually.

BRIEF DESCRIPTION OF THE DRAWINGS

The present disclosure is described further details with reference to the preferred embodiments and accompanying figures.

DETAILED DESCRIPTION

Figure 1:
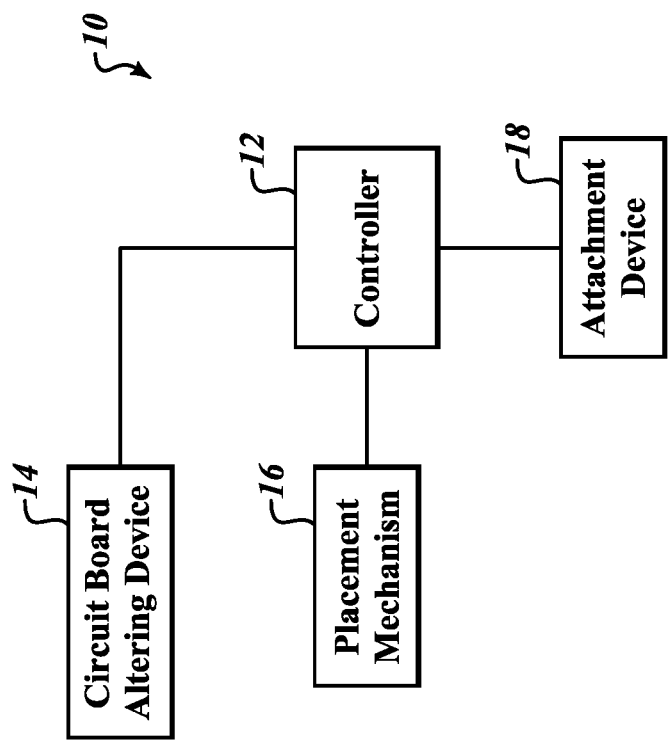
FIG. 1 shows an exemplary system formed in accordance with various embodiments.

FIG. 1 illustrates an exemplary system 10 for attaching devices to or near edges of circuit boards or other type of mounting/receiving board. In one embodiment, the system 10 includes a controller 12, a circuit board altering device 14, a placement device 16 and an attachment device 18. The controller 12 controls operation of the circuit board altering device 14, the placement mechanism 16 and the attachment device 18. The circuit board altering device 14 performs an initial predefined etch and/or machining operation on the printed circuit board using any of the number of different types of etching and/or machining techniques, such as chemically etching or mechanically cutting. The circuit board altering device 14 operates based on instructions received from the controller 12. The placement device 16 automatically retrieves a support device and places it at the circuit board. Then the placement device 16 automatically retrieves the to-be-attached devices and places them at a location on the circuit board according to instructions sent from the controller 12. Prior to retrieval of devices and placement of the devices on the altered circuit board, the attachment device 18 automatically performs at least a portion of an attachment step as directed by the controller 12. For example, the attachment device 18 may apply a solder material to a location on the printed circuit board that will receive the to-be-placed device. Once the device has been placed, the attachment device 18 completes the attachment process in order to bond the device to the print circuit board. The placement device 16 or another device removes a sacrificial part of the circuit board and removes the support device for possible reuse.

Figure 2:
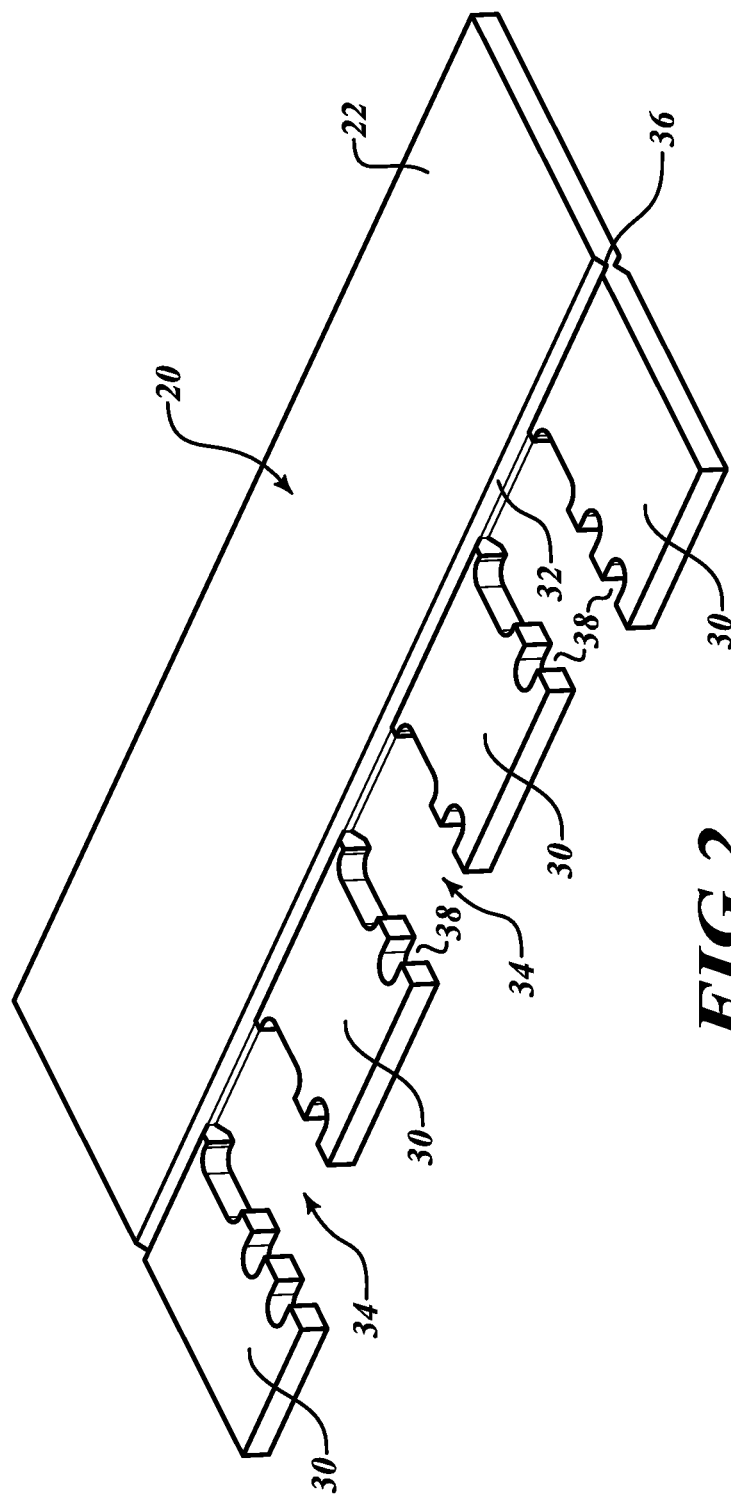
FIG. 2 is a perspective view of an exemplary circuit board prepared in accordance with an embodiment of the present invention.

FIG. 2 illustrates a perspective view of a printed circuit board (PCB) 20 (panelized form or not) fabricated in accordance with an embodiment of the present invention. The PCB 20 may or may not include circuit traces or other electrical interconnections. Prior to the mounting of any components on the PCB 20, the PCB 20 has been etched, cut or routed to provide a sacrificial support section 30 for the reception of larger devices (e.g., connectors) that will hang over the edge of the PCB 20. The section 30 has been etched or routed to include gaps 34 that exposes a permanent edge 32 of the PCB 20. A groove 36 between the sections 30 and a base section 22 of the PCB 20 has been partially etched or routed to allow for later removal of the sections 30. The groove 36 may be a routed edge of various shapes.

In another embodiment, the section 30 is a separate component from the PCB 20. If the section 30 is a separate component, it is temporarily attached (e.g., clamped) to the PCB 20 to execute the steps shown in FIGS. 3-5.

Figure 3:
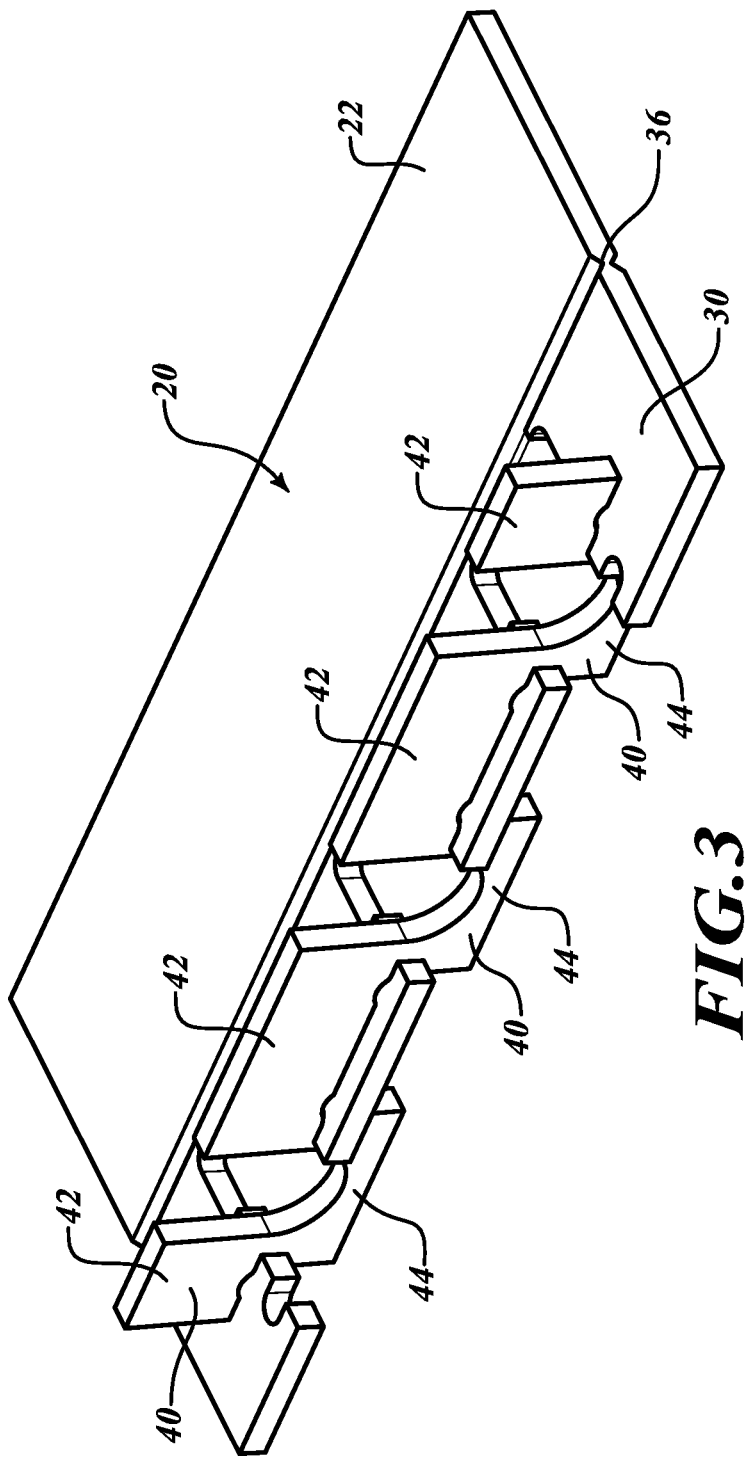
FIG. 3 is a perspective view of a support device placed within the circuit board of FIG. 2.

As shown in FIG. 3, a holder 40 is received within the section 30, such that the holder 40 remains in an approximately perpendicular and held in place with defined relationship to a major surface of the PCB 20. The edges of gaps 34 within the section 30 have been etched in order to accommodate reception of the holder 40. In one embodiment, the holder 40 slides into place from a position above the section 30. The holder 40 includes at least two upper horizontal sections 42 that are connected by a lower horizontal section 44. When the holder 40 is placed within the gaps 34 of the section 30, the upper sections 42 rest on top of the section 30, while the lower sections 44 pass below the surface of the section 30 and the PCB 20. The holder 40 is routed or etched to accommodate the device that the holder 40 will support.

The holder 40 may be made of any material that can handle the high-temperature reflow soldering process, such as metal, high temperature plastic, composite, fiberglass, printed circuit board comparable to PCB 20 or any material capable of withstanding and maintaining its mechanical stability during the assembly process.

In one embodiment, the lower residential sections 44 include a top edge that is shaped based upon the device that it is designed to support. For example, if the device to-be-attached is cylindrically-shaped, then the top edge of the lower horizontal sections 44 may or may not have a radius of curvature that matches the to-be-attached device.

In one embodiment, each 34 includes at least one holder receiving groove 38. A vertical section 48 of the lower horizontal sections 44 is received by a respective holder receiving groove 38. The holder receiving groove 38 keeps the holder 40 at a proper distance from the edge 32 and keeps the holder 40 in a proper vertical position. A bottom edge 50 of holder 40 rests on a top surface of the sacrificial section 30. The physical relationship between the holder 40 and the sacrificial section 30 may be a stable, snug or a snap fit.

In one embodiment, a corner between the bottom edge 50 and the outside edge of the vertical section 48 includes a radius of curvature. The curvature may be required as the tools creating the route have a radius and cannot cut a perfectly square finish between the two axis of the cut. Depending on the tool used (such as a laser cutter), a smaller or no curvature may be provided.

Figure 4:
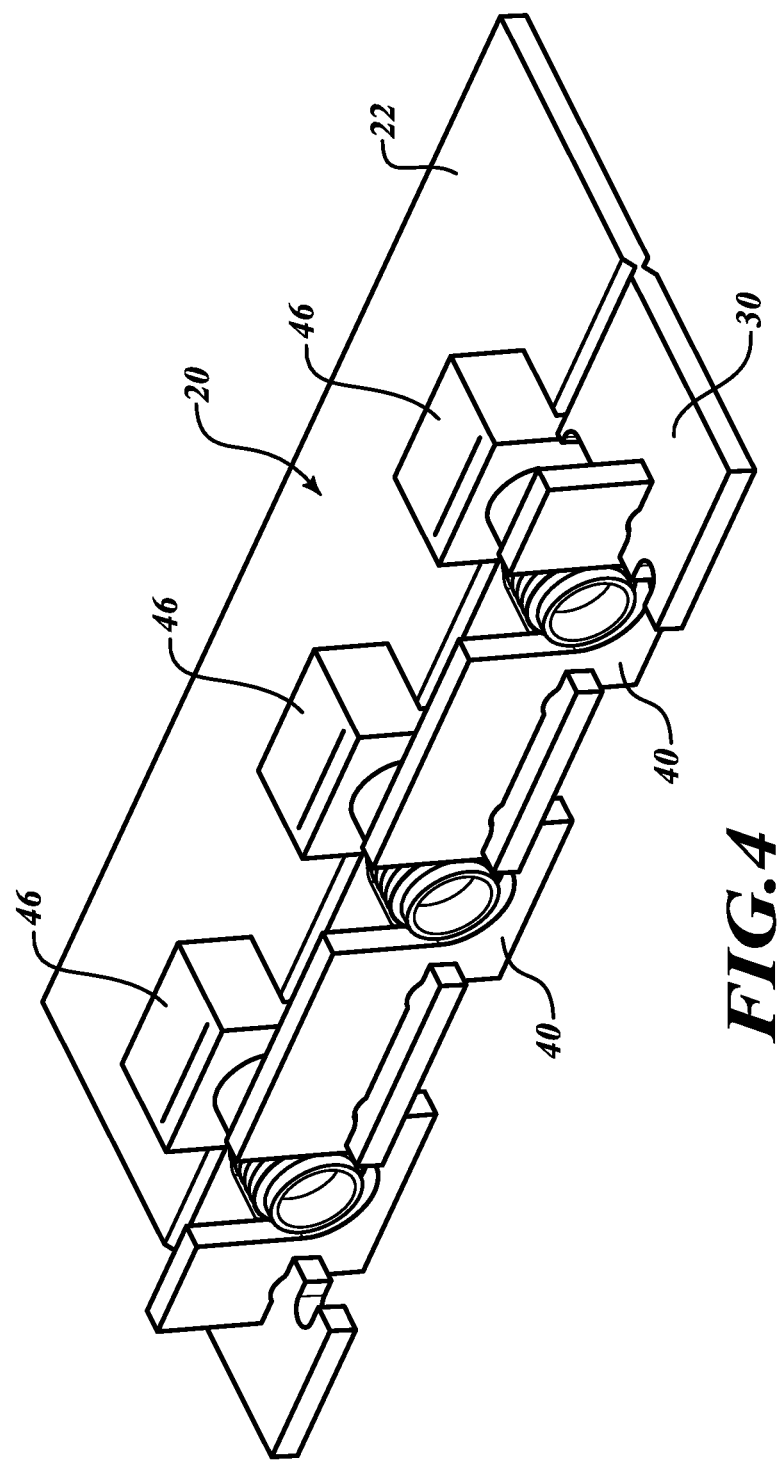
FIG. 4 is a perspective view showing an exemplary step wherein multiple plug type devices are mounted to an edge of the circuit board while being supported by the support device of FIG. 3.

As shown in FIG. 4, one or more large devices 46 are placed (manually or robotically) on the PCB 20 such that the devices 46 extend beyond the separation seam 36. Ends of the devices 46 that extend over and/or into the gap 34 of the section 30 are held in position (vertically and/or laterally) by the holder 40. In one embodiment, the devices 46 are simultaneously placed on the PCB 20 with other connectors, circuit components, etc. (not shown) that need to be soldered to the PCB 20. These devices are placed after application of a solder paste. Then, once the devices 46 and any other circuit components are ready to be soldered, then a single reflow process is performed.

Figure 5:
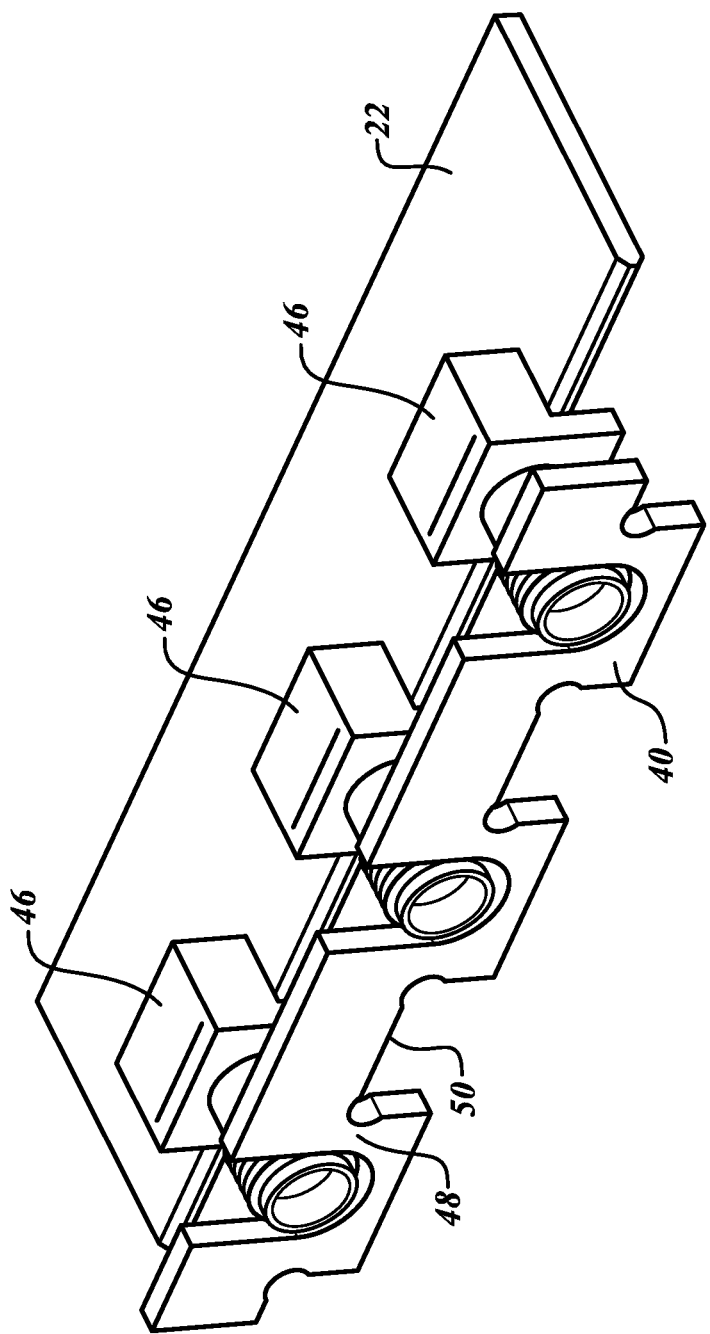
FIGS. 5 and 6 show perspective views of the circuit board with the attached plug type devices after a portion of the circuit board and the attachment support device have been removed.
Figure 6:
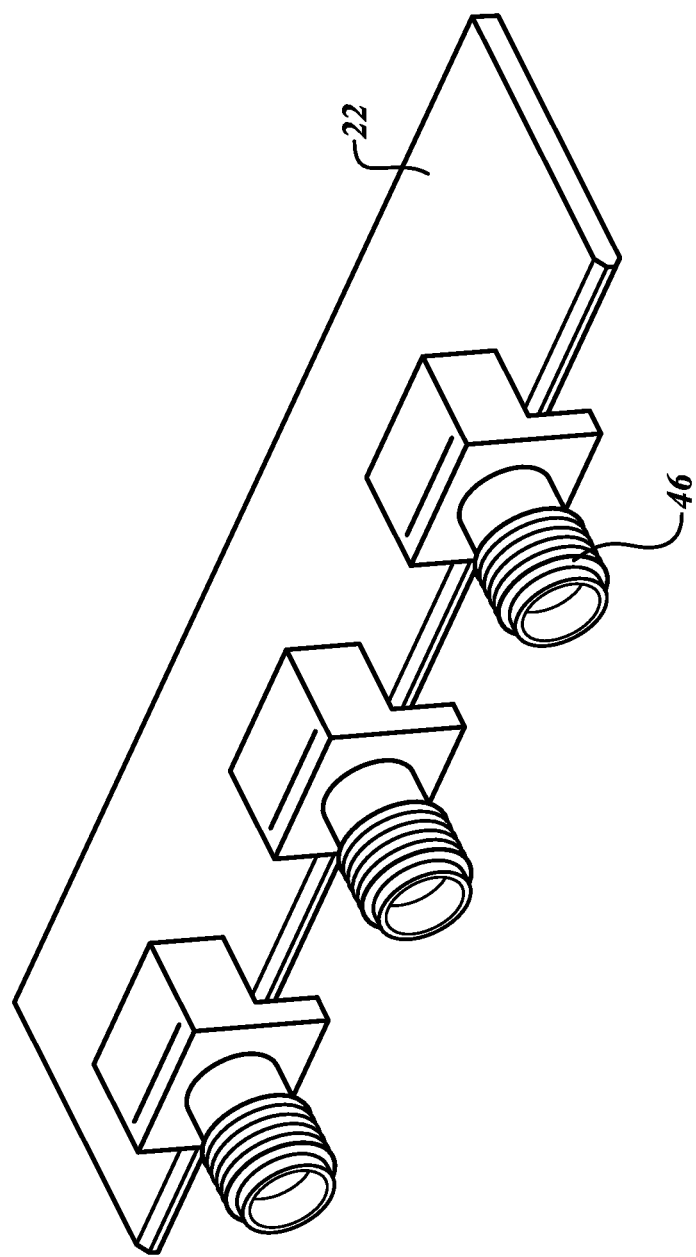

As shown in FIG. 5, the section 30 may be left or removed along the seam 36 after completion of the attachment process. After the removal of the section 30, the holder 40 is removed, as shown in FIG. 6, and possibly recycled.

In another embodiment, the section 30 is not necessary because the holder 40 is supported either manually or by a mechanism during the device attachment process.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. A method for attaching devices to ends of a receiving board, the method comprising:
   removing at least a portion of a sacrificial part of one of a receiving board or a supplemental component based on a predefined pattern;
   positioning a holder device or mounting bracket at a remaining portion of the sacrificial part of the receiving board or the supplemental component;
   placing a device at a predefined location on the receiving board, wherein the device is at least partially supported by a portion of the holder device or the mounting bracket;
   attaching the device to the receiving board; and
   removing the holder device or the mounting bracket and the remaining portion of the sacrificial part of the receiving board or the supplemental component.

2. The method of claim 1, wherein the receiving board comprises a circuit board.

3. The method of claim 2, wherein attaching comprises:
   applying a solder paste to a predefined location on the circuit board; and
   performing a predefined solder flow process.

4. The method of claim 2, wherein removing comprises at least one of etching or machining in accordance with the predefined pattern.

5. The method of claim 4, wherein removing further comprises forming a groove between the sacrificial part and a base section of the circuit board.

6. The method of claim 1, wherein inserting comprises applying pressure to the holder device perpendicular to a major plane of the receiving board.

* * * * *